United States Patent [19]

Bray

[11] Patent Number: 4,692,696

[45] Date of Patent: Sep. 8, 1987

[54] METHOD FOR ADJUSTING AND TESTING CURRENT SENSORS

[75] Inventor: Bernard D. Bray, Sycamore, Ill.

[73] Assignee: GTE Communication Systems Corporation, Phoenix, Ariz.

[21] Appl. No.: 760,210

[22] Filed: Jul. 29, 1985

[51] Int. Cl.[4] .................. G01R 35/00; G01R 31/02
[52] U.S. Cl. ............................ 324/158 R; 324/74; 324/202; 324/418
[58] Field of Search ............ 324/158 R, 418, 424, 324/202, 205, 74; 364/571

[56] References Cited

U.S. PATENT DOCUMENTS 3,355,659  11/1967  Burgess ..................... 324/418
4,156,191  5/1979  Knight et al. ............... 324/202

Primary Examiner—Ernest F. Karlsen
Attorney, Agent, or Firm—Robert J. Black; Gregory G. Hendricks

[57] ABSTRACT

A method of adjusting and testing for proper operation a current sensor by applying a threshold current value to the current sensor and adjusting the current sensor to a point just past the threshold of operation. Proper operation of the current sensor is tested by applying a non-operate current value followed by an operate current value to the sensor and checking for respective non-operate and operate output signals from the sensor. Messages, pass/fail indication, and audio signals are provided to signal test results to an operator.

9 Claims, 8 Drawing Figures

4,692,696

METHOD FOR ADJUSTING AND TESTING CURRENT SENSORS

CROSS REFERENCE TO RELATED APPLICATION

This application is related to commonly assigned, co-pending application Ser. No. 760,228, filed July 29, 1985, entitled "Current Sensor Adjustment and Test Apparatus" filed concurrently herewith.

BACKGROUND OF THE INVENTION

(1) Field of the Invention

The present invention relates to test apparatus and, more particularly, to an apparatus employing a microprocessor for adjusting and testing the operating point for proper operation of a current sensor employing a Hall Effect switch.

(2) Background Art

Current sensing devices employing an electromagnetic coil and a Hall Effect switch have been previously disclosed under U.S. Pat. Nos. 4,166,928 ('928) and 4,191,859 ('859) issued Sept. 4, 1979 and Mar. 4, 1980, respectively, both to Sabon. Such devices are useful in detecting the presence or the absence of a telephone subscriber loop before and after ringing current is applied to the loop. Also known in the art are test circuits which detect failures of Hall Effect device operate and release points. Such test circuits are described under U.S. Pat. No. 4,488,112 ('112) issued Dec. 11, 1984 to Thompson et al. and U.S. Pat. No. 4,491,794 ('794) issued Jan. 1, 1985 to Daley et al. Such test circuits apply an electromagnetically generated varying field to the Hall Effect switch and verify either in an analog manner as in patent '112 or in a digital manner as in patent '794 that the Hall Effect switch switches only above a certain magnetic field intensity and below a second greater magnetic field intensity.

Also known is a method and apparatus for adjusting magnetic coupling between a Hall Effect switch and a permanent magnet which is described under U.S. Pat. No. 4,156,191 issued May 22, 1979 to Knight et al. This patent teaches a method and apparatus for setting the relationship between the magnetic flux of a permanent magnet and a Hall Effect switch by demagnetizing the magnet.

The above devices, while related to the present invention do not address the problem of adjusting and testing for proper operation, a current sensing device employing a Hall Effect switch operated by a magnetic field generated by a magnetic circuit employing an electromagnetic coil driven by the sensed current.

Accordingly, it is object of the present invention to provide an adjustment and test apparatus which provides a new and useful method of adjusting and testing for proper operation, electromagnetic current sensors of the type described in the '928 and '859 patents.

SUMMARY OF THE INVENTION

The present invention provides a microprocessor driven test apparatus including a microprocessor connected to outputs of a current sensor under test via a test fixture circuit provided to hold and establish circuit connections to the current sensor under test. The microprocessor also includes circuit connections to a constant current source. The current source is connected to the current sensor under test and, in response to signals from the microprocessor, generates a constant current to drive the current sensor under test. The microprocessor is additionally connected to an operator indicating circuit employing both visual and audio indicators. A parameter input circuit is provided and connected to the microprocessor to select variable device parameters and also to select one of several test, or adjustment and test sequences. A reset circuit is provided and connected to the microprocessor to reset and initialize the microprocessor when power is turned on, when a test sequence is interrupted before terminating, and also in cases of manual reset. Finally, the apparatus includes a test start circuit connected between the microprocessor and a test fixture circuit.

The test circuit is activated in response to inserting a current sensor in the fixture and closing the fixture. These actions will interrupt the microprocessor and start a test, or adjustment and test sequence.

The present invention also relates to a method of adjusting and testing a current sensor employing an electromagnetic coil and a Hall Effect switch by applying a threshold current to the electromagnetic coil and adjusting the current sensor to just past the operate point. The current sensor is then driven by a non-operate current followed by an operate current value during which the current sensor is checked for an unoperated output followed by an operated output value.

DESCRIPTION OF THE PREFERRED EMBODIMENT

Figure 1:
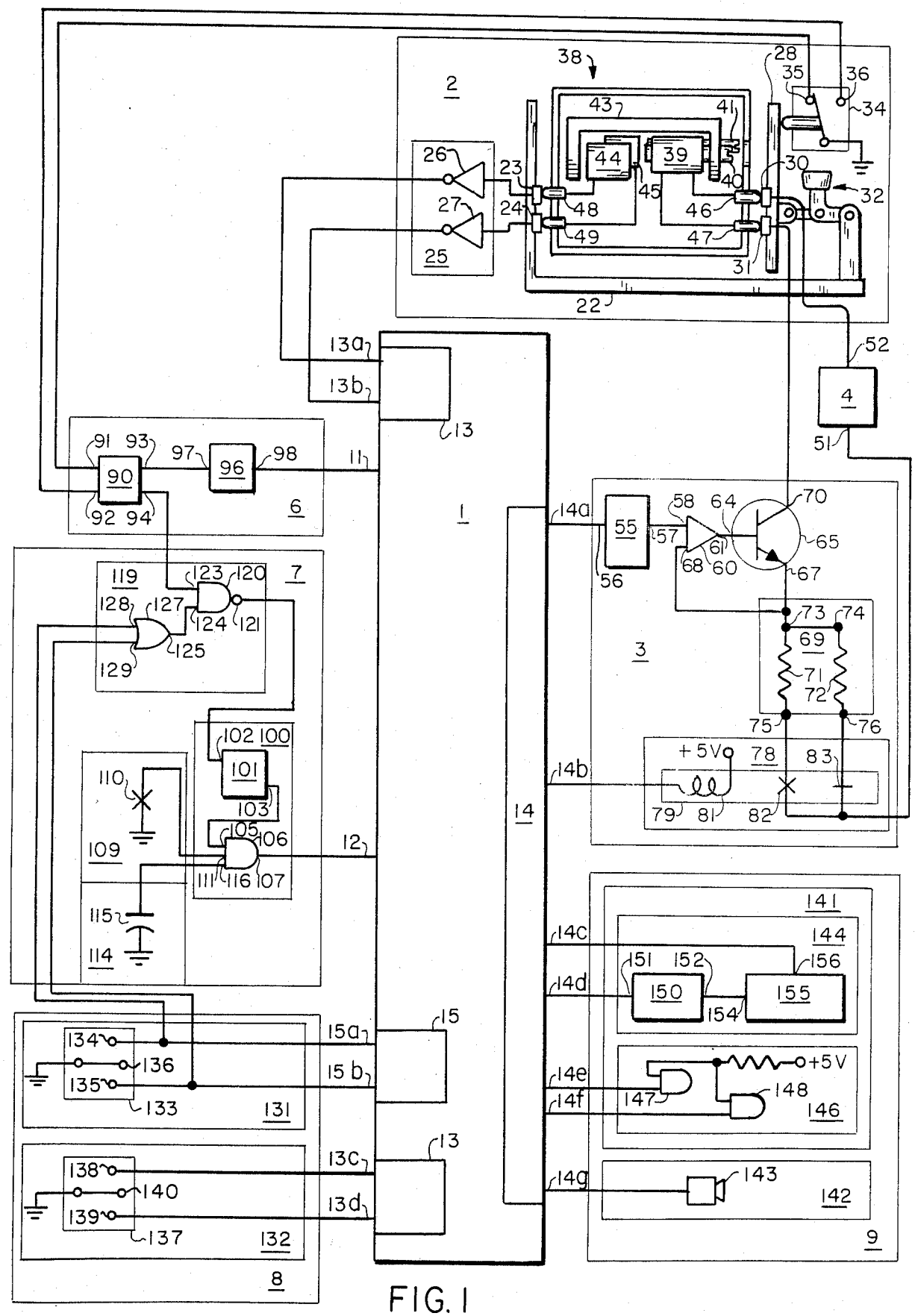
FIG. 1 is a schematic representation of the adjustment and test apparatus in accordance with the present invention.

Referring now to FIG. 1 there is shown a current sensor adjustment and test apparatus including a microprocessor 1, a test fixture circuit 2, a constant current source 3 connected between the test fixture circuit 2 and the microprocessor 1, and a test power source 4 connected between the test fixture circuit 2 and the constant current source 3. The adjustment and test apparatus of the present invention additionally includes a test start circuit 6 connected between the test fixture circuit 2 and the microprocessor 1, a reset circuit 7 connected between the test start circuit 6 and the microprocessor 1, and a parameter input circuit 8 connected between the reset circuit 7 and the microprocessor 1. Finally, the adjustment and test apparatus of the present invention includes an indicating circuit 9 connected to the microprocessor 1.

The microprocessor 1 may be of any type commonly known in the art which includes an internal memory for program storage, an interrupt input 11, a reset input 12, a plurality of input ports 13, a plurality of output ports 14, and plurality of hybrid input/output ports 15.

The test fixture circuit 2 includes a test fixture 22 including a pair of fixed contacts 23 and 24 connected to corresponding input ports 13a and 13b of the input ports 13 of the microprocessor 1 by an also included switch signal conditioning circuit 25.

The switch signal conditioning circuit 25 includes a first buffer gate 26 connected between the fixed contact 23 and the input port 13a and a second buffer gate 27 connected between the fixed contact 24 and the input port 13b.

The test fixture circuit 2 includes a moveable retainer 28 slideably attached to the test fixture 22 and including a pair of moveable contacts 30 and 31 which are affixed thereto. The retainer 28 is positioned relative to the test fixture 23 by a sliding actuator mechanism generally denoted by the numeral 32. A fixture closed sensor 34 is included in the test fixture circuit 2 and is operated to ground a first terminal 35 when the retainer is in a closed position and to ground a second terminal 36 when the retainer is an open position.

The test fixture circuit 2 and the test fixture 22 are arranged to accept a Hall Effect current sensor under test 38 which is undergoing test, or adjustment and test. The current sensor under test 38 may be of the type including a electromagnetic coil 39, a pair of magnetic circuit adjusting slugs 40 and 41, a heel piece 43, and a pair of Hall Effect switches 44 and 45 connected in a magnetic circuit. The electromagnetic coil 39 may be connected to pair of electrical contacts 46 and 47 for the purpose of energizing the coil. The contacts 46 and 47 are positioned to contact the moveable contacts 30 and 31, respectively. The Hall Effect switches 44 and 45 may each include a output connected to a corresponding terminal 48 and 49.

The test power source 4 includes a ground terminal 51 and also a power terminal 52 connected to the coil contact 46 via the moveable electrical contact 30 attached to the retainer 28.

The constant current source 3 includes a digital-to-analog converter 55 including a plurality of inputs 56 connected to corresponding outputs 14a of the outputs 14 of the microprocessor 1, and an output 57 connected to a non-inverting input 58 of an operational amplifier 60. The operational amplifier 60 includes an output 61 connected to a base 64 of a current pass transistor 65. The current pass transistor 65 includes an emitter terminal 67 connected to an inverting input 68 of the operational amplifier 60 and also a circuit connection to a current sensor 69. The current pass transistor 65 additionally includes a collector terminal 70 connected to the moveable contact 31 of the retainer 28 of the test fixture circuit 2.

The current sensor 69 includes a first resistor 71 and a second resistor 72 connected together at a first end of each resistor 73 and 74, respectively. The connected resistor ends 73 and 74 are further connected to the emitter terminal 67 of the current pass transistor 65 and to the inverting input 68 of the operational amplifier 60. The resistors 71 and 72 each include a corresponding second terminal 75 and 76, respectively.

The constant current source 3 additionally includes a range select circuit 78 including a relay 79 having an operate coil 81, a set of make contacts 82 and break contacts 83. The make contacts 82 include a first circuit connection to the second terminal 75 of the first resistor 71 and a second circuit connection to the ground terminal 51 of the test power source 4. The break contacts include a first circuit connection to the second terminal 76 of the resistor 72 and a second circuit connection to the ground terminal 51 of the test power source 4.

The test start circuit 6 includes a start latch 90 including a set input 91 connected to the first terminal 35 of the fixture closed sensor 34, a reset input 92 connected to the second terminal 36 of the fixture closed sensor 34, a set output 93 and a reset output 94. The test start circuit 6 additionally includes a single pulse generator 96 including an input 97 connected to the set output 93 of the latch 90 and an output 98 connected to the interrupt input 11 of the microprocessor 1.

The reset circuit 7 includes a reset signal generator 100 including a single pulse generator 101 having an input terminal 102 and an output terminal 103 connected to a first input 105 of an AND gate 106. The AND gate 106 includes an output 107 connected to the reset input 12 of the microprocessor 1. The reset circuit 7 includes a manual circuit 109 comprising a grounding switch 110 connected to a second input 111 of the AND gate 106. The reset circuit 7 additionally includes a power up circuit 114 including a grounded capacitor 115 connected to a third input 116 of the AND gate 106. Finally, the reset circuit 7 includes a generator disable circuit 119 including a NAND gate 120 including an output 121 connected to the input 102 of the single pulse generator 101. The NAND gate 120 includes a first input 123 connected to the reset output 94 of the latch 90. And a second input 124 connected to an output 125 of an OR gate 127 which includes a first input 128 and a second input 129.

The parameter input circuit 8 includes a device select circuit 131 and a test select circuit 132. The device select circuit 131 includes a three position grounding device select switch 133 including a first terminal 134 connected to the first input 128 of the OR gate 127 and also to an input/output port 15a of the input/output ports 15 of the microprocessor 1 in its first position. The three position grounding switch 133 additionally includes a third terminal 135 connected to the second input 129 of the OR gate 127 and also to an input/output port 15b of the input/output ports 15 of the microprocessor 1 in a third position. Finally the three position grounding switch includes a second terminal 136 to which no circuit connections are made. The device select switch 133 will apply ground potential to each terminal when placed in the corresponding position.

The test select circuit 132 includes a three position grounding test select switch 137 including a first terminal connected to an input port 13c of the input ports 13 of the microprocessor 1 in a first position and a third terminal 139 connected to an input port 13d of the input ports 13 of the microprocessor 1 in a third position. The three position grounding switch 137 finally includes a second terminal 140 to which no circuit connections are made. The test select switch 137 will apply ground potential to each terminal when placed in the corresponding position.

The indicating circuit 9 includes a visual indicating circuit 141 and an audio indicating circuit 142 including a sounder 143 connected to an output port 14g of the output ports 14 of the microprocessor 1. The visual indicating circuit 141 includes a message display 144 and a pass/fail indicating circuit 146 including a "pass" light emitting diode 147 and a "fail" light emitting diode 148 each connected to a corresponding output port 14e and 14f of the output ports 14 of the microprocessor 1. The message display 144 includes a segment driver 150 including a plurality of inputs 151 connected to corresponding output ports 14d of the output ports 14 of the microprocessor 1 and a plurality of outputs 152 connected to a corresponding plurality of inputs 154 of a message display panel 155. The message display panel 155 includes an additional plurality of inputs 156 connected to corresponding output ports 14c of the output ports 14 of the microprocessor 1.

The present invention is operated by first applying power to the microprocessor and all related circuitry. In this regard power may be applied to the microprocessor 1, to test fixture circuit 2, constant current source 3, test power source 4, the test start circuit 6, the reset circuit 7, the parameter input circuit 8 and the indicating circuit 9. As power is applied, the initially discharged state of the capacitor 115 of the power up circuit 114 will apply a low signal to the third input 116 of the AND gate 106. The low signal thus applied will cause a low signal to be generated at the output 107 of the AND gate 106 and the signal transmitted therefrom to the reset terminal 12 of the microprocessor 1 resetting the microprocessor as power is turned on and comes up to its normal operating voltage thereby preventing the microprocessor from assuming an undetermined state. After a predetermined period of time the capacitor 115 will charge up and present to the third input 116 a high signal which will in turn be reflected to the output 107 of the gate 106 and therefrom to the reset input 12 of the microprocessor 1 terminating the reset of the microprocessor.

Figure 2:
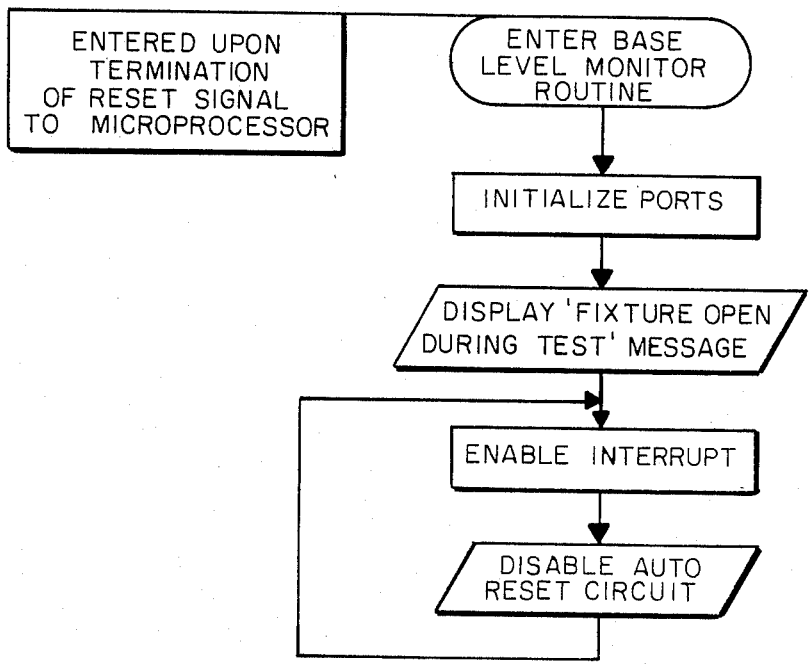
FIG. 2 is a flow chart depicting the base level processing steps utilized to adjust and test a current sensor in accordance with the present invention.
Figure 3:
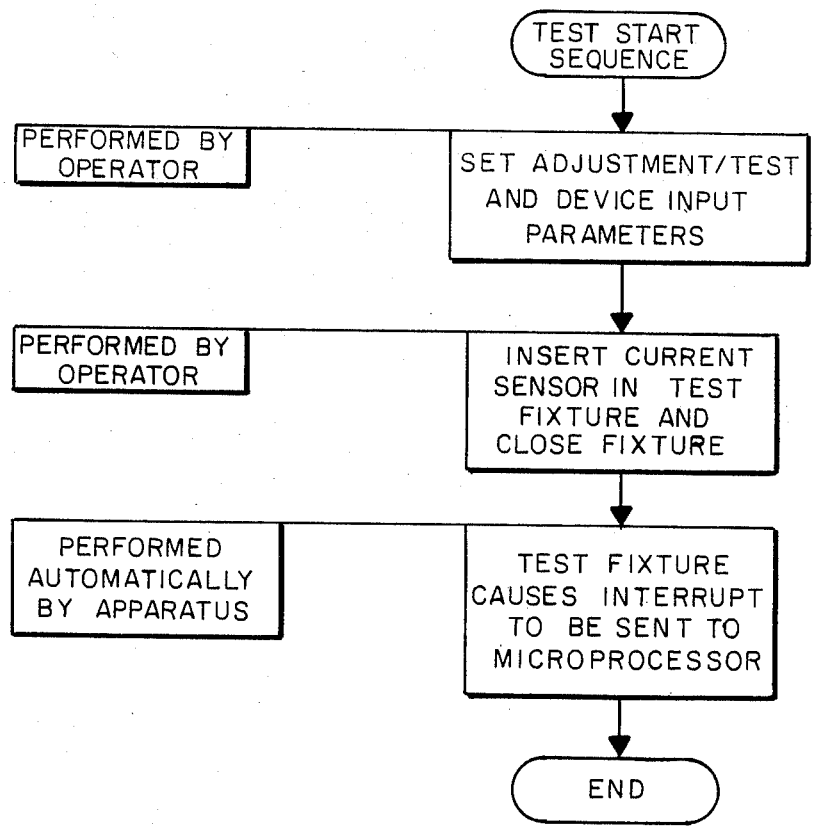
FIG. 3 is a flow chart depicting the steps performed to initiate a test sequence.
Figure 4A:
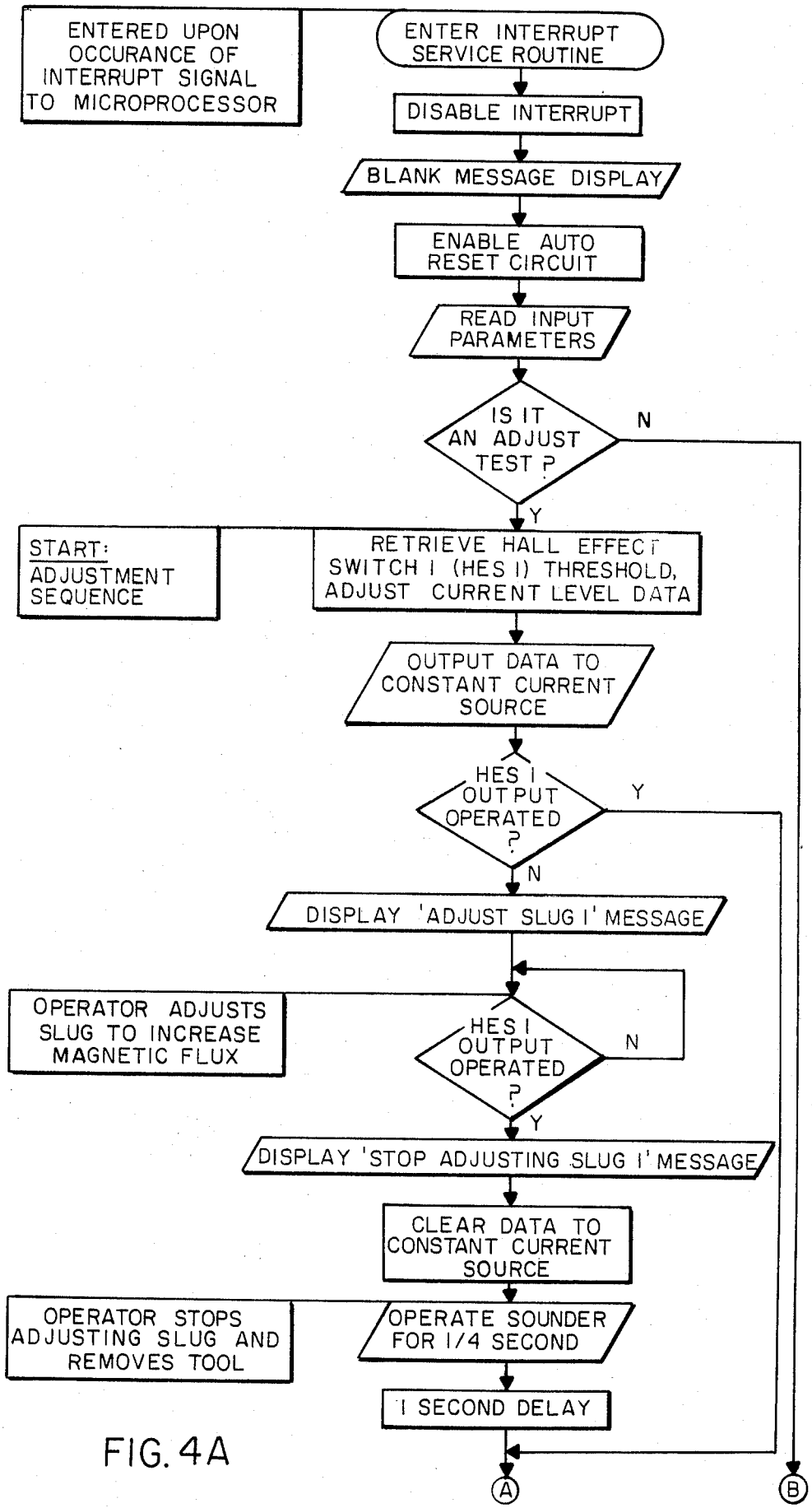
FIGS. 4A through 4E is a flow chart depicting the steps performed to adjust and test a current sensor in accordance with the present invention.
Figure 4B:
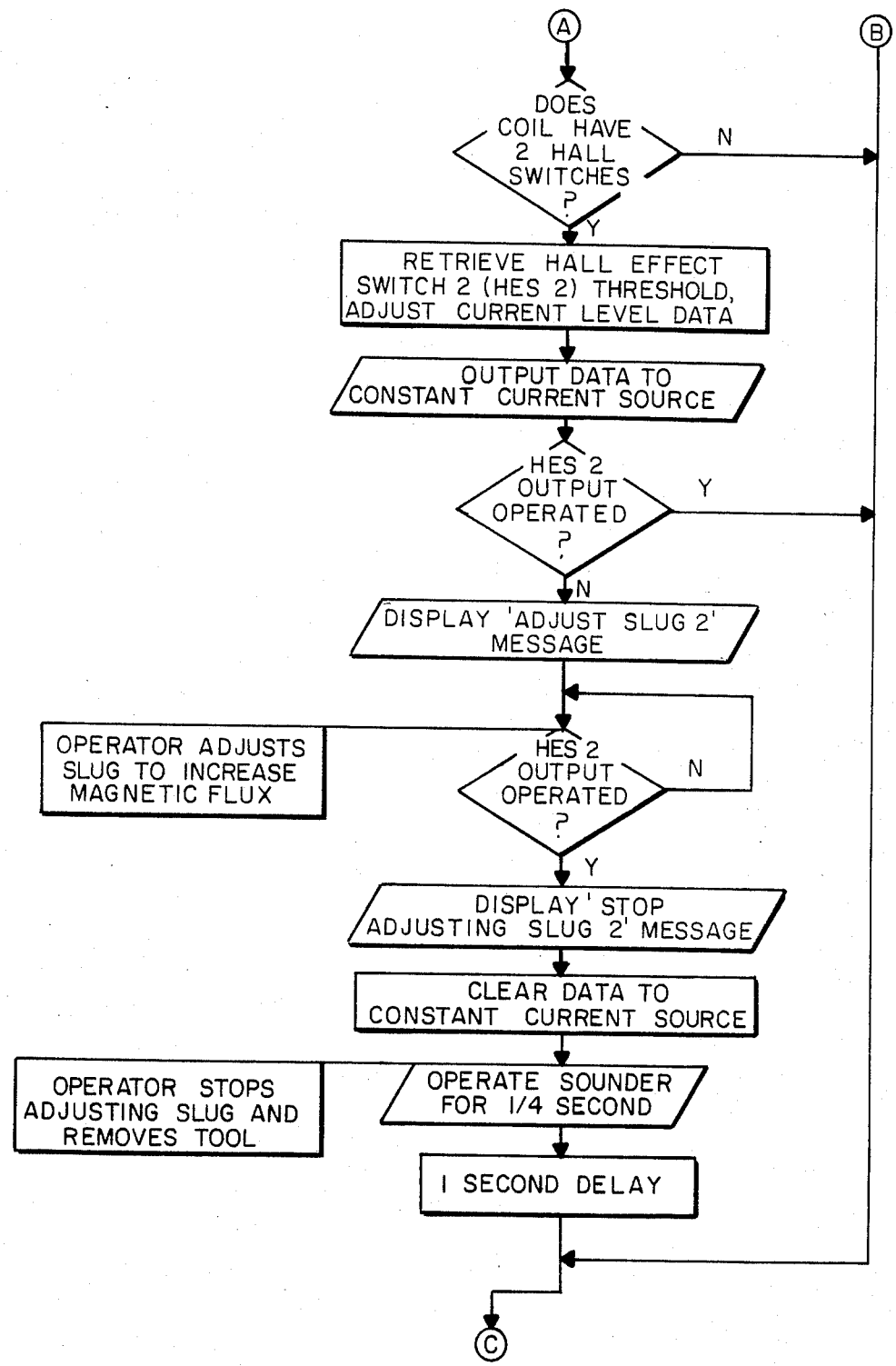
Figure 4C:
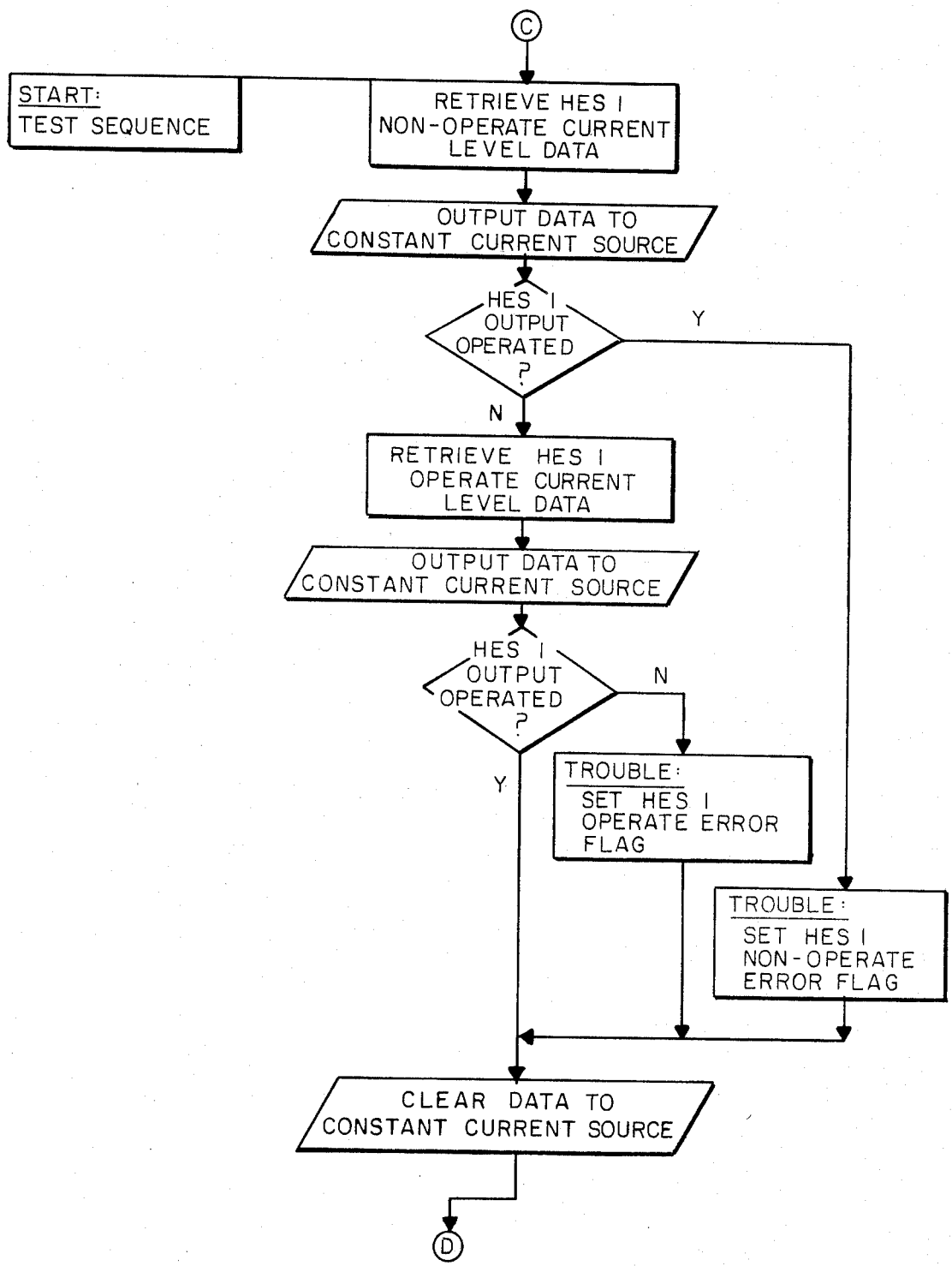
Figure 4D:
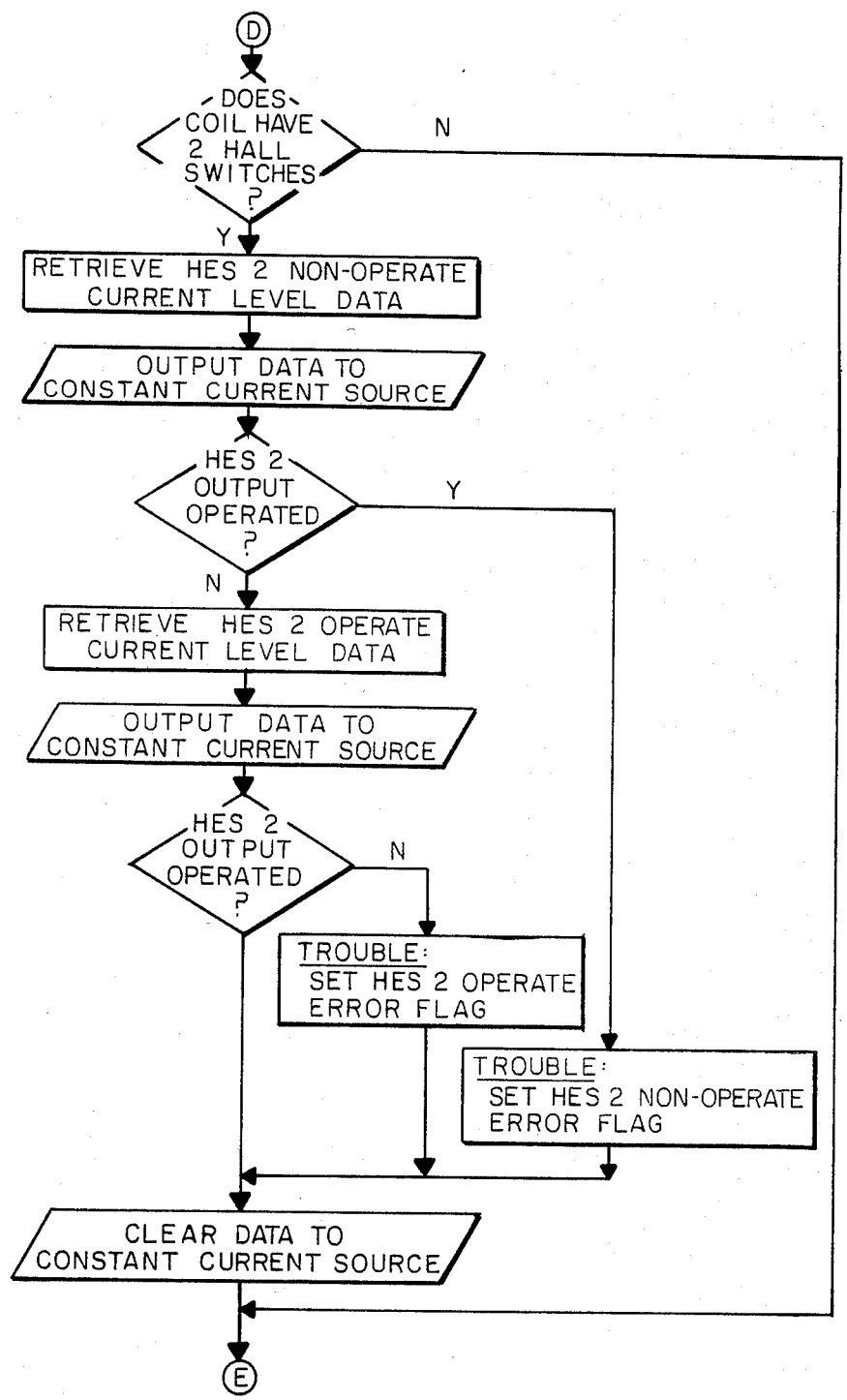
Figure 4E:
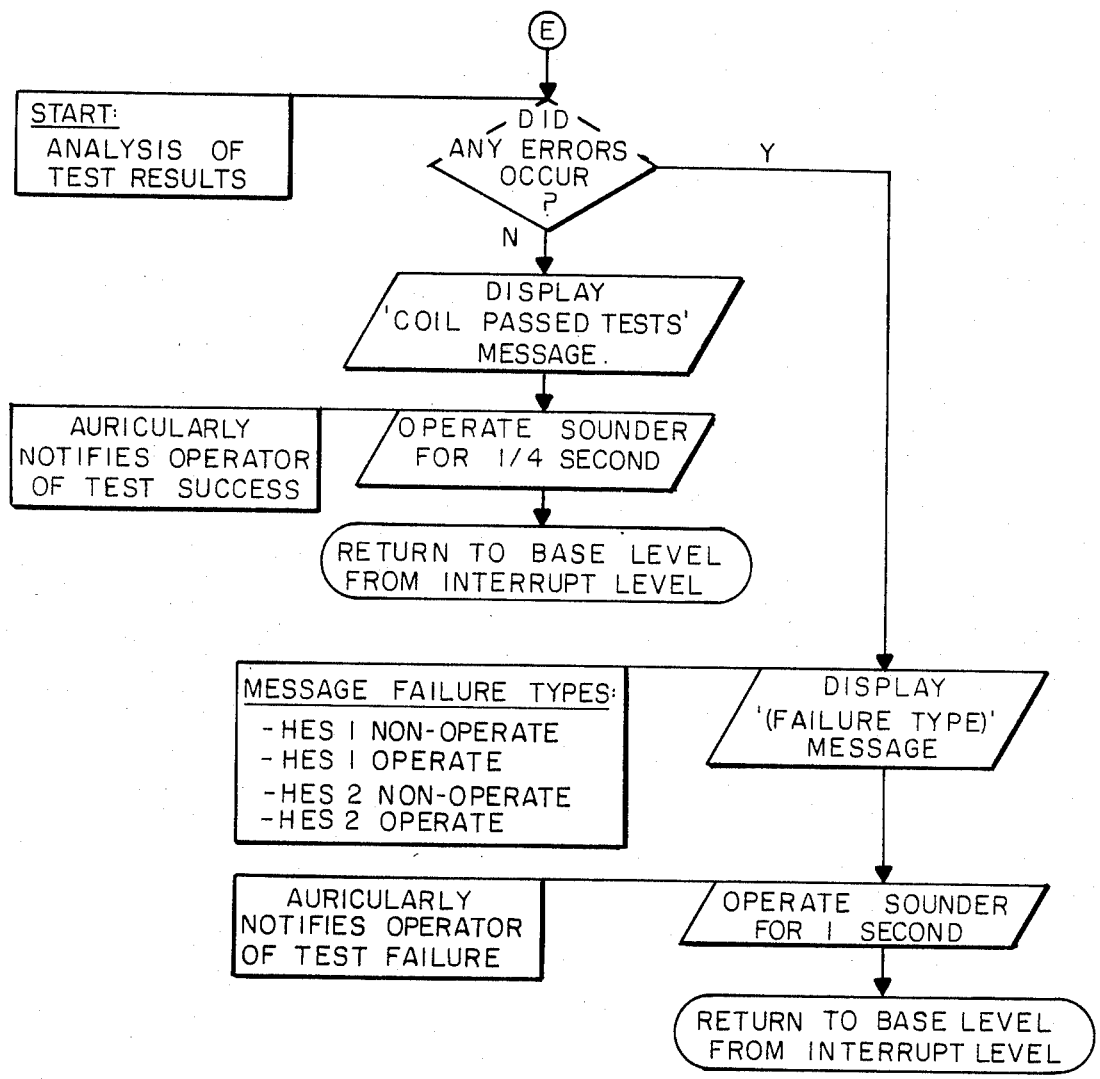

The microprocessor 1 includes a therein stored program operating in two modes; a base level mode (see FIG. 2) and an interrupt level mode (see FIGS. 4A through 4E). It will be understood that the operation of the microprocessor in both modes is controlled by the therein stored program. It will also be understood that the actions of the microprocessor as hereinafter described are determined by the program stored in the microprocessor.

Upon receiving the reset signal via the input 12, the microprocessor 1 will reset its internal circuitry. Upon termination of the reset signal via the input 12, the microprocessor 1 will initialize all the input ports 13, the output ports 14 and the input/output ports 15. The microprocessor 1 will then output signals via the corresponding output ports 14c and 14d connected to the segment driver 150 and message display panel 155, respectively, in a sequence to display a "fixture opened during test" message on the display panel 155. The microprocessor 1 will then enable the reception of interrupts via the interrupt terminal 11 and disable the reset circuit 7 by writing a low signal to the input/output ports 15a and 15 b connected to the first and second inputs 128 and 129 of the OR gate 127, respectively. This action will produce a low signal at the output 125 of the OR gate 127 which will then be transmitted to the second input 124 of the NAND gate 120 to thereby produce a high signal at the output 121 of that gate. In this state, the NAND gate 120 will be insensitive to signals received on the first input 123 thereby disabling the reset circuit 7. The above described state will exist until the Hall Effect current sensor to be tested 38 is inserted in the test fixture circuit 2 and the fixture is closed.

An adjustment and test sequence for a Hall Effect current sensor will now be described. In preparing to adjust and test for proper operation a Hall Effect current sensor in accordance with the present invention it is necessary to first select test parameters. In this regard, the three position device select grounding switch 133 of the device select circuit 131 is operated to select an appropriate set of parameters for the particular Hall Effect current sensor 38 to be tested. Up to three devices may be selected with the selection determined by the switch position selected by the operator. Next, a test to be conducted is selected utilizing the three position test select grounding switch 137 of the test select circuit 132. Finally, the operator will position the current sensor undergoing test 38 within the test fixture 22 in such a manner that its sensor output terminals 48 and 49 are in alignment with the fixture contacts 23 and 24 of the test fixture circuit 2 and the contacts 46 and 47 of the electromagnetic coil 39 are in alignment with the moveable contacts 30 and 31 of the retainer 28. The actuating mechanism 32 of the test fixture circuit 2 is then operated by the operator to slide the retainer in a direction towards the Hall Effect current sensor under test thereby engaging the moveable contacts 30 and 31 with the contacts 46 and 47 and the fixed contacts 23 and 24 with the contacts 48 and 49, respectively. In its operated position the retainer 28 will operate the fixture closed sensor 34 to open circuit the second terminal 36 and ground the first terminal 35 of that sensor. The grounded condition of the terminal 35 of the fixture closed sensor 34 will present a low signal to the set input 91 of the latch 90 thereby setting the latch and producing a high signal at the set output 93. The high signal at the output 93 of the latch 90 will be transmitted to the input 97 of the single pulse generator 96 thereby causing a low going reset pulse to be generated at the output 98 and therefrom transmitted to the interrupt input 11 of the microprocessor 1 causing the microprocessor to stop its base level processing and enter its interrupt level processing mode (see FIGS. 4A through 4E).

In the interrupt mode of processing, the microprocessor 1 will disable the interrupt input 11 via circuitry internal to the microprocessor 1, clear the message display 144 via the thereto connected output ports 14c and 14b, and enable the automatic reset circuit 7 by writing a high signal to the input/output ports 15a and 15b connected to the device select circuit 131 and therefrom to the inputs 128 and 129 of the OR gate 127. At this point the position of the device select circuit grounding switch 134 will determine the status of the inputs 128 and 129 of the OR gate 127. However, because of the arrangement, at least one of the inputs will be at a high signal level which will be sufficient to generate a high signal at the output 125 of the OR gate. The high signal at the output 125 of the OR gate 127 will be transmitted to the second input 124 of the NAND gate 120 thereby permitting input signals via the first input 123 to be reflected in an inverted state at the output 121 of the NAND gate 120 thereby enabling the reset circuit 7. This enabled state of the reset circuit 7 will exist until a test sequence is completed and the input/output ports 15a and 15b of the microprocessor 1 are once again forced to a low signal state thereby disabling the reset circuit 7 as described above.

The microprocessor will then read the input/output ports 15a and 15b connected to the device select circuit 131 and the input ports 13c and 13d connected to the test select circuit 132 and analyze them to determine which of three devices has been selected and which of three test only, or adjust and test sequences has been selected. The exact combination of grounded and ungrounded switch terminals is not important; it need only be appreciated that a particular switch terminal combination signifies to the microprocessor that a particular device to be tested or that a particular test only, or adjustment and test sequence to be executed. As mentioned above, it will be assumed at this point that an adjustment and test sequence is to be run.

The computer, in initiating an adjustment and test sequence, will retrieve from its memory the appropriate threshold adjusting value for the particular device selected in the form of a digital value and output that value via the output ports 14a connected to the constant current source 3 digital-to-analog converter 55 via the inputs 56. The microprocessor will additionally retrieve from its memory, for a particular device being selected, the range select circuit value and output that value to the relay 79 of the range select circuit 78 via the thereto connected output port 14b thereby energizing, or not energizing the relay coil 81 as is required for the test being conducted. If the relay 79 is operated, the make contacts 82 will prepare a circuit path for the first resistor 71 of the current sensor 69 to the test power source 4 ground terminal 51. If the relay 79 is not operated, the break contacts 83 will prepare a circuit path for the second resistor 72 of the current sense 69 to the test power source 4 ground terminal 51. Operation of the constant current source 3 will be readily apparent to one skilled in the art and as such will not described in detail here.

The microprocessor 1 will then output data via the output port 14c and 14d to the visual indicating circuit 14 to cause the message display 144 to display an "adjust slug 1" message on the message display and 155. The microprocessor 1 will then enter a program loop waiting for the output of the Hall current sensor under test to output a high signal at the input port 13a.

At this point the operator, upon receiving the adjust slug message, will insert an adjusting tool into the first slug 40 and proceed to adjust the slug in a predetermined direction until the first Hall Effect switch 44 senses sufficient magnetic flux generated by the coil 39 through the magnetic circuit to generate a low output signal via its output terminal 48. The low output signal will be conditioned and inverted by buffer gate 26 of the switch signal conditioning circuit 25 and therefrom be transmitted to the input port 13a of the microprocessor 1 where it will be sensed by the microprocessor as the high signal.

Upon sensing a high signal from the Hall sensor under test, the microprocessor 1 will output data to the message display 144 of the visual indicating circuit 141 in a manner to cause a "stop adjusting slug 1" message to be displayed on the message display panel 155. The microprocessor 1 will then clear the outputs 14a and 14b connected to the constant current source 3 thereby turning off the constant current source. At this point the microprocessor 1 will output via output port 14g a signal to the audio indicating circuit 142 sounder 143 for a time period of one quarter second. The sounder and the display message will serve as notice to the operator to cease adjusting the slug 42 and to remove the slug adjusting tool.

At this point the microprocessor 1 will determine if the Hall current sensor under test is equipped with a second Hall Effect Switch 45 and if not, the microprocessor 1 will enter a test sequence as described below. If the second Hall Effect switch 45 is equipped, the microprocessor 1 will retrieve the threshold current level data for the second Hall Effect switch 45 and output it to the digital-to-analog converter 55 of the constant current source 3 as described above for the first Hall Effect switch 44. The microprocessor 1 will then output data to cause the message display panel 155 of the message display 144 to display an "adjust slug 2" message and enter a loop examining the second Hall Effect switch 45 for a low signal at the output terminal 49 which, when buffered and inverted by buffer gate 27 of the switch signal conditioning circuit 25, will appear at input port 13b as a high signal. At this point the operator will begin adjusting the second slug 41 in the same manner as described above for the first slug 40. When the second Hall device 45 senses sufficient magnetic flux to output a low signal to the sensor signal conditioning circuit buffer gate 27 and therefrom to the input port 13b of the microprocessor 1, the microprocessor will sense such high signal and output data via output ports 14c and 14d to the message display 144 to cause the message display panel 155 to display a "stop adjusting slug 2" message. The microprocessor 1 will then clear the output port 14a and 14b data to the constant current source 3 thereby turning off the constant current source, output data to the output port 14g to sound the sounder for one quarter second and delay for one second to permit the operator to cease adjusting the second slug and remove the slug adjusting tool.

At this point the microprocessor 1 will enter a test sequence to verify that the Hall current sensor 38 will produce an operated signal with the appropriate current level flowing through its coil 39 and similarly will produce a non-operated signal with a second current level flowing through its coil 39, these tests performed for each equipped Hall Effect device 44 and 45 as appropriate. In conducting the test sequence, the microprocessor 1 will first retrieve from its memory a switch 1 non-operate current level data value from its memory and output it to output ports 14a and 14b thereby activating the current source 3. The microprocessor 1 will then check that the first Hall Effect switch 44 is not operated by examining the input port 13a for a low signal. If the first Hall Effect switch 44 is operated in error (high signal at input port 13a), the microprocessor 1 will record this fact by setting a switch 1 non-operate error flag within its memory. The microprocessor 1 will then proceed to conduct an operate test of the first Hall Effect switch 44 by retrieving a switch 1 operate current level data value from its memory and outputting it to the output ports 14a and 14b connected to the constant current source 3 and checking the switch 1 input port 13a for a high signal. If a low signal is received in error at the input port 13a, the microprocessor 1 will set a switch 1 operate error flag within its memory. The microprocessor 1 will then clear the constant current source ports 14a and 14b in preparation for further tests.

At this point the microprocessor 1 will determine if the current sensor under test 38 is equipped with two Hall sensing switches and, if not, the microprocessor 1 will check for error flags as described below. If, on the other hand, a second Hall Effect switch is equipped, the microprocessor 1 will check the second Hall sensing switch in the same manner as was done for the first Hall sensing switch setting the appropriate switch 2 non-operate and switch 2 operate error flags.

At the conclusion of the test sequence, the microprocessor 1 will check the switch 1 and switch 2 operate and non-operate error flags to determine if any of the flags are set. If any of the flags are set, the microprocessor 1 will display the error type of the first set error flag on the message display panel 155, sound the sounder 143 for a period of one second and return from the interrupt level processing mode to the base level processing mode at the point where the base level program was interrupted thereby completing the test sequence.

If, on the other hand, none of the error flags are set, the microprocessor 1 will display a "coil passed test" message on the message display panel 155, sound the sounder 143 for one quarter of a second and return to the base level processing mode from the interrupt level processing mode at the point where the base level processing mode was interrupted thereby completing a successful test sequence.

Finally, upon entering the base level processor mode following the generation of "pass" or "fail" message, the microprocessor 1 will again disable the reset circuit 7 by writing a low signal to the input/output ports 15a and 15b.

The adjustment and test apparatus of the present invention additionally includes the ability to permit the operator to interrupt and stop a testing sequence at any point. In this regard, should the test fixture be opened during a test sequence, the fixture closed sensor 34 will unground the first terminal 35 and ground the second terminal 36 of that sensor thereby resetting the start circuit latch 90 and producing a high signal at the latch reset output 94. The high signal from the start circuit latch 90 will be transmitted to the first input 123 of the NAND gate 120. As a result of the microprocessor 1 operating in the interrupt level during a test sequence, a high signal will be written to the input/output ports 15a and 15b. These high signals will be transmitted to the first and second inputs 128 and 129 of the OR gate 127 causing that gate to output a high signal via its output 125 to the second input 124 of the gate 120. The high signal at the second input 124 of the NAND gate 120 will sensitize the output 121 of that gate to the signals received on the first input 123 of that gate. As a result of this, when the input 123 changes to a high signal level in response to the start signal latch 90 resetting, the NAND gate 120 will output a low signal to the input 102 of the single pulse generator 101 of the reset signal generator 100. The low signal at the input 102 will cause the single pulse generator 101 to output a low going pulse at its output 103 which will then be transmitted to the first input 105 of the AND gate 106 and therefrom to the reset input 12 of the microprocessor 1 thereby resetting the microprocessor. Operation of the microprocessor 1 following termination of the reset pulse will be as described above for power turn on of the microprocessor 1.

The current sensor adjustment and test apparatus of the present invention may optionally include an additional check of the current sensor under test for a proper level of preadjustment magnetic flux prior to requesting the operator to adjust the appropriate magnetic slug. In this regard, following application of the adjust threshold current value to the sensor under test and before causing the message display to display an "adjust slug" message the microprocessor 1 will check the input port 13a or 13b, as appropriate, for a low signal indicating that the Hall Effect switch requires additional flux to produce the proper output signal. If the low signal is sensed, adjusting will proceed as described above. However, if a high signal is sensed, the adjustment sequence will be completely bypassed and the next test, or adjustment sequence performed. That is, if the first switch produced a sensed high signal, the second switch, if equipped, will be prepared for adjustment, otherwise the test sequence will be executed on the current sensor under test. If on the other hand a second equipped switch produces sensed high signal, the test sequence will be executed on the current sensor under test.

In addition to the adjustment and test sequence described above, two "test only" sequences may be performed on any of the three selectable devices. In this regard, a "go/no-go" test may be performed to establish that a particular device falls within published device specifications. Further, a "quality assurance" test may be performed to establish that sufficient tolerance exists in the device's operate and release current level points to assure test it will meet published specifications in actual use.

Although the preferred embodiment of the present invention has been illustrated, and the form described in detail it will be readily apparent to those skilled in the art that various modifications may be made therein without departing from the spirit of the invention or the scope of appended claims.

What is claimed is:

1. A method of adjusting and testing a current sensing apparatus to a predetermined operated condition and a predetermined non-operated condition, comprising the steps of:
   automatically applying a threshold current value to said apparatus, under control of a microcomputer;
   automatically adjusting said apparatus to a state just past the threshold of operation, under control of a microcomputer;
   automatically applying a non-operate current value to said apparatus, under control of a microcomputer;
   automatically first checking said apparatus for a non-operate output signal, under control of a microcomputer;
   automatically applying an operate current value to said apparatus, under control of a microcomputer; and
   automatically second checking said apparatus for an operate output signal, under control of a microcomputer.

2. A method as claimed in claim 1 before applying said threshold current, there is further included the additional step of inserting said apparatus in a test fixture.

3. A method as claimed in claim 2 wherein: after said inserting step and before applying said threshold current, there is further included the additional step of detecting that said apparatus is inserted in said test fixture.

4. A method as claimed in claim 1 wherein: is further included the additional step of testing for an initially unoperated condition before performing said adjusting step.

5. A method as claimed in claim 1 wherein: there is further included the additional step of generating a visual "success" signal following checking said apparatus for an operate output signal and on condition of said non-operate signal being generated in response to application of said non-operate current value to said apparatus and of said operate signal being generated in response to application of said operate current value to said apparatus.

6. A method as claimed in claim 1 wherein: there is further included the additional step of generating a visual first failure signal after said second checking step and on condition of said first checking step failing.

7. A method as claimed in claim 6 wherein: there is further included the additional step of generating a visual second failure signal after said second checking step and on condition of said second checking step failure.

8. A method as claimed in claim 1 wherein: said adjusting step is performed manually and is immediately preceded by the added step of automatically generating an indication to said operator instructing said operator to manually adjust said apparatus.

9. A method as claimed in claim 8 wherein: said adjusting step is immediately succeeded by the automatic step of detecting said state just past the threshold of operation of said apparatus and the automatic step of generating an indication to said operator instructing said operator to cease adjusting said apparatus.

* * * * *